United States Patent

Van Duyne

[15] 3,678,343

[45] July 18, 1972

[54] CERAMIC SUBSTRATE INTERCONNECTION DEVICE

[72] Inventor: Robert Earl Van Duyne, Fair Haven, N.J.

[73] Assignee: Bell Telephone Laboratories, Incorporated, Murray Hill, N.J.

[22] Filed: Aug. 30, 1971

[21] Appl. No.: 175,869

[52] U.S. Cl. ....................317/100, 317/101 DH, 339/17 LM

[51] Int. Cl. ....................H05k 7/14, H05k 7/18

[58] Field of Search ....................317/100, 101 D, 101 DH; 339/17 LM, 17 M, 17 N, 74 R

[56] References Cited

UNITED STATES PATENTS

| | | | |
|---|---|---|---|
| 3,475,657 | 10/1969 | Knowles | 317/100 X |
| 3,418,534 | 12/1968 | Koons | 317/101 DH |
| 3,328,646 | 6/1967 | Caillat | 317/101 DH |

FOREIGN PATENTS OR APPLICATIONS

| | | | |
|---|---|---|---|
| 857,975 | 1/1961 | Great Britain | 339/17 LM |

*Primary Examiner*—Lewis H. Myers
*Assistant Examiner*—Gerald P. Tolin
*Attorney*—R. J. Guenther et al.

[57] ABSTRACT

A device for interconnecting a plurality of integrated circuit ceramic substrate pairs via common printed circuit boards substantially comprises a frame having the boards attached thereto in parallel spaced relationship to each other and perpendicular to the individual substrates. Associated with each substrate pair to form a module are first and second camming members and first and second backing plates, each plate being directly adjacent to and in intimate contact with its associated substrate. Upon insertion of the camming members into associated channels on the frame, a force directed longitudinally along the device is applied to the backing plates thereby separating the plates and urging conductive terminals located along opposite edges of the substrates against associated resilient spring contacts mounted on the frame. It is a feature of this invention that the structural backing plate also serves to dissipate heat generated by its associated substrate.

9 Claims, 9 Drawing Figures

CERAMIC SUBSTRATE INTERCONNECTION DEVICE

FIELD OF THE INVENTION

This invention relates to electrical connectors and, in particular, to devices for interconnecting a plurality of integrated circuit ceramic substrate pairs via common printed circuit boards.

BACKGROUND OF THE INVENTION

As more low powered devices become available, circuit packaging density tends to increase. This is advantageous since efficient utilization of space is of utmost importance in the design of electronic equipment. Further, the use of integrated circuit ceramic substrates for both digital and analog circuits has become economically advantageous. Therefore, it is not uncommon today to find densely packed integrated circuit ceramic substrate arrangements. Since a substrate contains a large number of integrated circuits, typically 10 to 20, it is desirable that individual substrates be easily removable from associated circuitry for troubleshooting. In addition, such densely packed ceramic substrate arrangements require the dissipation of large amounts of heat generated by the integrated circuitry.

It is therefore an object of this invention to provide a device for electrically interconnecting a plurality of integrated circuit ceramic substrates.

It is another object of this invention to provide a device for electrically connecting conductive terminals on a ceramic substrate to associated conductive paths on a printed circuit board.

It is a further object of this invention to provide a device for electrically interconnecting a plurality of ceramic substrates without resort to soldering techniques.

It is a still further object of this invention to provide a ceramic substrate interconnection device which permits for the dissipation of circuit generated heat.

SUMMARY OF THE INVENTION

According to the present invention, a device for interconnecting a plurality of integrated circuit ceramic substrate pairs via common printed circuit boards substantially comprises a frame having the boards attached thereto in parallel spaced relationship to each other and perpendicular to the individual substrates. Associated with each substrate pair to form a module are first and second camming members and first and second backing plates, each plate being directly adjacent to and in intimate contact with its associated substrate. Upon insertion of the camming members into associated channels on the frame, a force directed longitudinally along the device is applied to the backing plates thereby separating the plates and urging conductive terminals located along opposite edges of the substrates against associated resilient spring contacts mounted on the frame. An intermediate portion of each C-shaped resilient spring contact protrudes outwardly from the frame and presses against a conductive path on its associated printed circuit board.

According to an illustrative embodiment of the invention, the structural backing plate further comprises outwardly extending fin portions for improving the dissipation of heat generated by the plate's associated substrate.

According to a second illustrative embodiment of the invention, the resilient spring contacts further comprise nonconductive plastic strips located on the central portions thereof for preventing accidental electrical contact with the substrate terminals during insertion and removal of the substrate.

It is an advantage of this invention that it allows for high density packaging of integrated circuit ceramic substrates.

It is another advantage of this invention that it can be mass produced.

It is a further advantage of this invention that it allows easy insertion and removal of a ceramic substrate from an interconnecting device without damage to itself or to adjacent substrates.

It is a still further advantage of this invention that no damage results to either the conductive terminals on the ceramic substrate or the resilient spring contacts on the frame during insertion or removal of the substrate.

It is a still further advantage of this invention that the ceramic substrates do not require lead frames attached thereto.

It is a still further advantage of this invention that it provides a simple, inexpensive, and reliable device for electrically interconnecting a plurality of ceramic substrates.

It is a feature of this invention that it can be manufactured and assembled in modular form.

It is another feature of this invention that the contact force is substantially zero during insertion and removal of the substrates.

It is a further feature of this invention that the contact force is applied only after the substrate is inserted into the device.

It is a still further feature of this invention that the structural backing plate also serves to dissipate heat generated by its associated substrate.

DESCRIPTION OF THE DRAWING

The above and other objects, advantages, and features of this invention will be better appreciated by a consideration of the following detailed description and the drawing in which.

DETAILED DESCRIPTION

Figure 1:
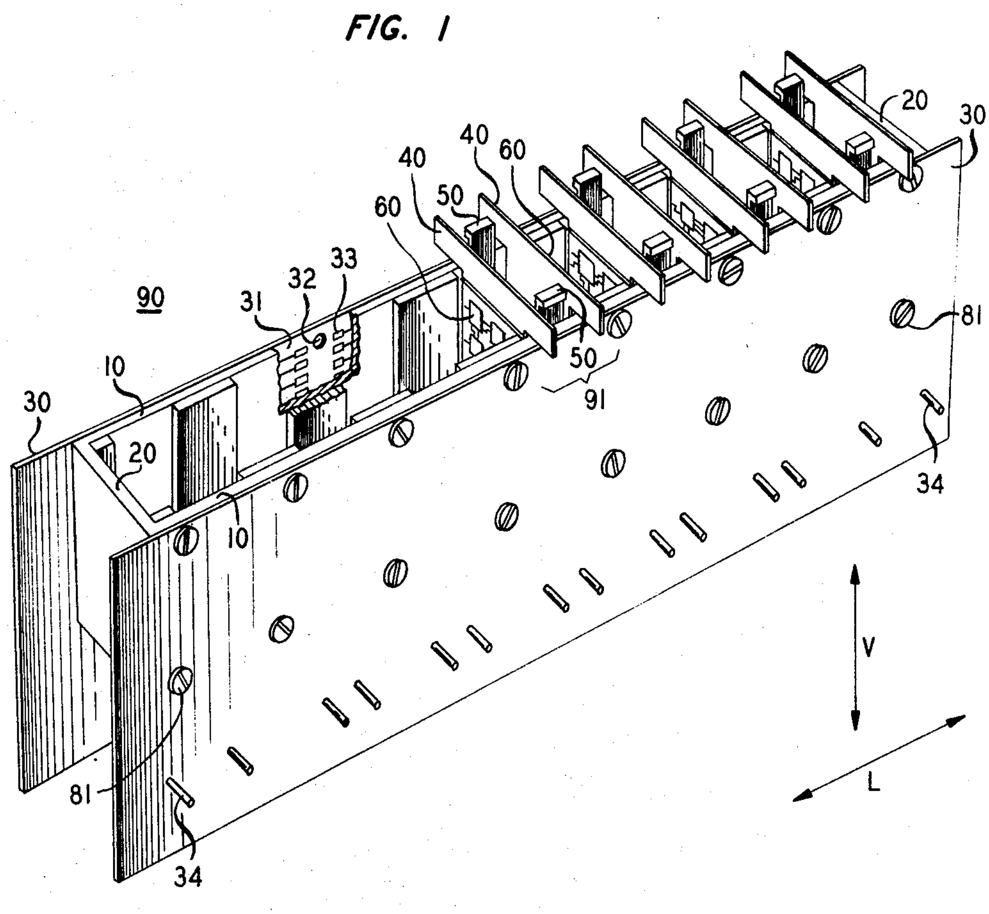
FIG. 1 is a perspective view, partially fragmentary, of a ceramic substrate interconnection device according to the present invention.

FIG. 1 is a perspective view, partially fragmentary, of a ceramic substrate interconnection device according to the present invention. Device 90 generally comprises first and second side frames 10, first and second end frames 20, first and second printed circuit boards 30, and a plurality of substrate modules 91 each including first and second backing plates 40, first and second camming members 50, and first and second integrated circuit ceramic substrates 60. Side frames 10 are held in parallel spaced relationship to each other by end frames 20 according to methods well known in the prior art. Also, boards 30 are individually secured to an associated side frame 10 by mechanical fastening means, such as screws 81. Further, plates 40, which are parallel to each other, are directly adjacent to and in intimate contact with their associated substrates 60. Finally, plates 40 and substrates 60 are perpendicular to boards 30 whereas camming members 50 are parallel to boards 30.

Unless otherwise specified, the description herein relates specifically to basic substrate module 91. It is apparent that device 90 could comprise a plurality of separate modules 91 mechanically and electrically joined to form the overall device wherein the length of the device would be substantially equal to the length of one module multiplied by the number of modules utilized. It is also apparent that in certain applications only one substrate of the pair would be required; in such a case a dummy substrate could be utilized. In addition, for explanatory purposes, the vertical and longitudinal directions V and L, respectively, relative to device 90 are shown in FIG. 1.

Referring now to the fragmentary portion of FIG. 1, there is shown flat inner surface 31 of board 30 including hole 32, which is utilized for securing board 30 to side frame 10. Surface 31 also includes parallel conductive strips or paths 33 which are utilized to electrically connect board 30 to substrates 60 via resilient spring contacts mounted on side frame 10, as will be explained later. Paths 33 are joined to wire wrap terminals 34 or other appropriate means for connecting device 90 to external electrical circuitry. It should be noted that board 30 may be rigid or semirigid and may include passive and active circuitry in addition to paths 33.

Figure 2:
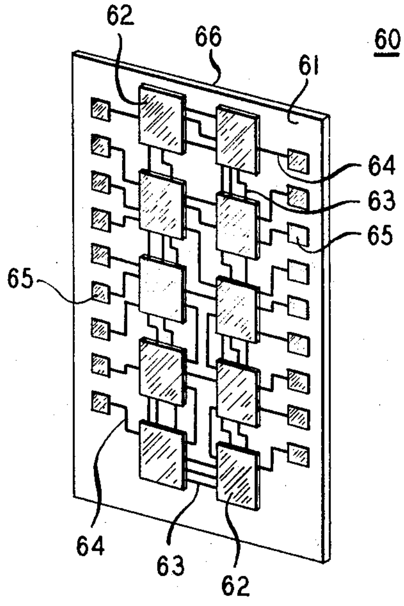
FIG. 2 is a perspective view of an integrated circuit ceramic substrate utilized in the device of FIG. 1.

FIG. 2 is a perspective view of an integrated circuit ceramic substrate utilized in device 90 of FIG. 1. Substrate 60 comprises flat surface 61 which includes integrated circuitry 62. Circuitry 62 is well known in the prior art and thus will not be discussed in detail herein. Surface 61 also includes conductive strips or paths 63 for interconnecting individual circuits 62 and includes paths 64 for interconnecting circuitry 62 to outwardly extending widened paths or terminals 65. Terminals 65, which are generally deposited or etched onto surface 61 and thereafter plated with gold using well-known techniques, are vertically disposed adjacent to two opposite margins or edges of surface 61. The other side of substrate 60, designated as surface 66, includes no integrated circuitry or conductive paths. As will be explained later, terminals 65 are utilized to electrically connect substrate 60 to associated paths 33 of board 30 via resilient spring contacts mounted on side frame 10. It should be noted that substrate 60, which is substantially rigid, does not have attached thereto beam leads or lead frames, as generally required in conventional structures.

Figure 3A:
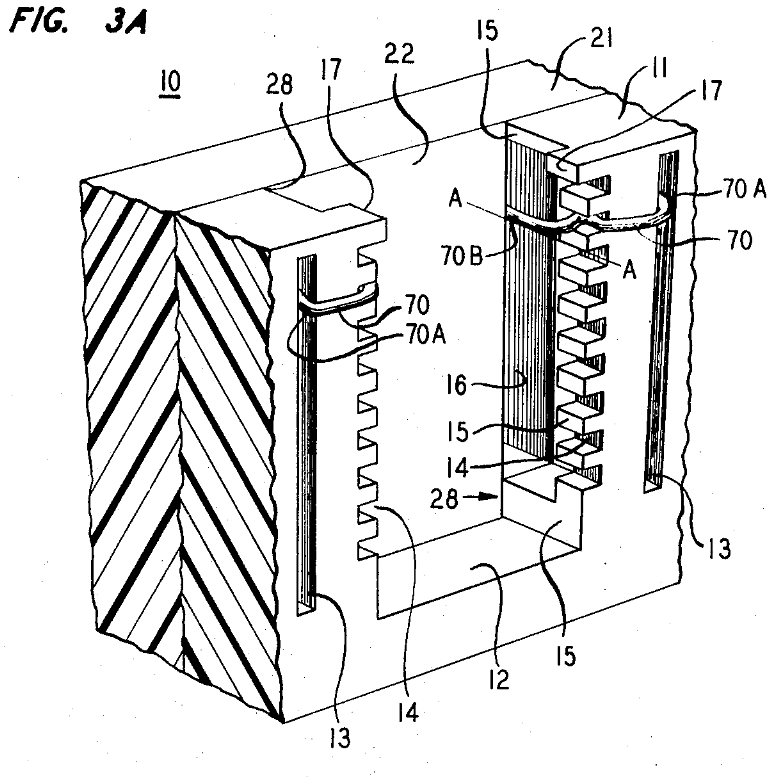
FIGS. 3A and 3B are perspective views of a frame according to the present invention as seen from the inside and outside of the device of FIG. 1, respectively.

FIG. 3A is a perspective view of side frame 10 as seen from the inside of device 90. For illustrative purposes, frame 10 is shown comprising inner segment 11 and outer segment 21, each segment being advantageously made of an insulative molded plastic. Segment 11 includes first and second parallel vertical slots 13 and a generally U-shaped channel portion formed by horizontal edge surface 12 and vertical parallel walls 15. These channel portions are adapted to receive and guide camming members 50, as will be explained later. Located on each wall 15 is a plurality of parallel horizontal grooves 14, each groove being perpendicular to boards 30 in the assembled device. On the upper portion of each wall 15 is provided lip or step 17, which is used for restraining the upper edge of substrate 60 in the assembled device. In other words, step 17 prevents misplacement or misalignment of substrate 60 after camming members 50 are fully inserted into device 90. Corners 28 are formed by the intersection of surface 22 of outer segment 21 and vertical walls 15 of inner segment 11. Finally, segment 11 also includes vertical apertures 16.

FIG. 3A also shows C-shaped resilient spring contacts 70 mounted on side frame 10 as they would appear in the assembled device. Contacts 70 are constructed of a resilient metal having good electrical conductive properties, such as gold plated beryllium-copper or phosphor-bronze. Each horizontal groove 14 is adapted to receive intermediate portion 70B of an associated contact 70, while each vertical slot is adapted to receive end portion 70A. It will be shown with reference to FIG. 6 that each terminal 65 of substrates 60 is adapted to engage intermediate portion 70B of an associated contact 70 along tangential line A—A, which is perpendicular to boards 30 in the assembled device.

Figure 3B:
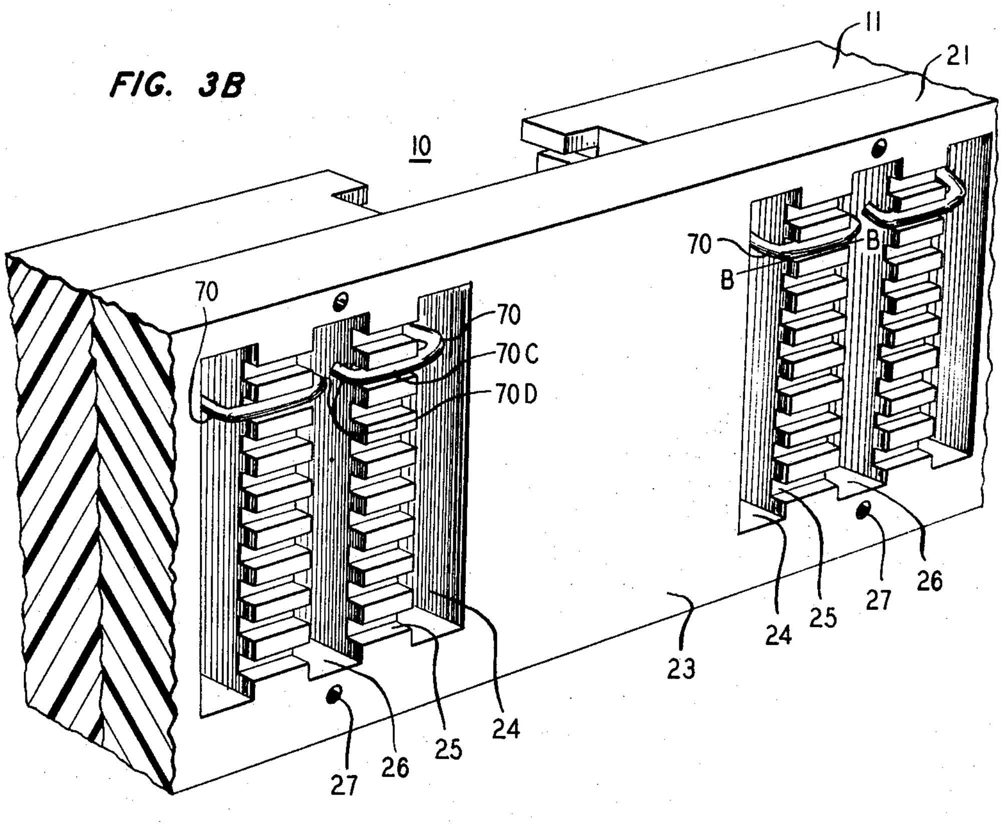

FIG. 3B is a perspective view of side frame 10 as seen from the outside of device 90. Outer segment 21 of frame 10 includes surface 23, first and second parallel vertical through slots 24, and first and second parallel vertical slots 26. Located on surface 23 is a plurality of parallel horizontal grooves 25, each groove being parallel to boards 30 and aligned with an associated groove 14 on inner segment 11. Surface 23 further includes through holes 27 which connect to associated tapped holes, not shown, on inner segment 11. It is by means of these holes that board 30, outer segment 21, and inner segment 11 are secured by mechanical fastening means, such as screws 81 (FIG. 1). Each slot 24 is in communicating relationship with associated aperture 16 of segment 11. Also, slots 26 are slightly wider than slots 13 since each slot 26 receives two adjacent end portions 70D of two contacts 70, whereas each slot 13 receives only one end portion 70A of one contact 70, as shown in FIGS. 3A and 3B. Each horizontal groove 25 is adapted to receive intermediate portion 70C of an associated contact 70, while each vertical slot 26 is adapted to receive end portion 70D. It will be shown with reference to FIG. 6 that each path 33 of board 30 is adapted to engage intermediate portion 70C of an associated contact 70 along tangential line B—B, which is parallel to boards 30 in the assembled device.

Figure 4:
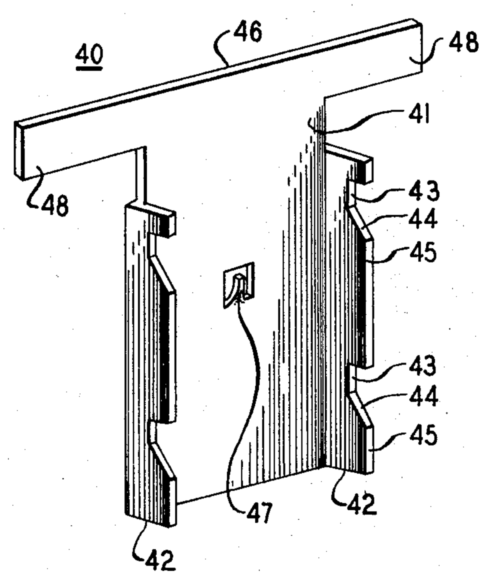
FIG. 4 is a perspective view of a backing plate according to the present invention.

FIG. 4 is a perspective view of a backing plate according to the present invention. Structural plate 40, which is advantageously made of a metal such as aluminum, comprises flat surface 41, flat surface 46 on the other side of surface 41, first and second parallel flanges 42 extending in the same direction away from and perpendicular to surface 41, mounting projection 47, and first and second fins 48. Each flange 42 includes first and second ramp portions 44 extending from associated notch 43 to associated edge portion 45. Mounting projection 47 is utilized to connect a coil spring to plate 40. Further, surface 66 of substrate 60 intimately contacts surface 46 of plate 40, as will be further discussed hereinafter. Also, flanges 42 of each plate are adapted to coact with camming members 50 for urging associated substrate 60 against resilient spring contacts 70 on side frame 10. Finally, fins 48 are utilized to improve the dissipation of heat generated by the plate's associated substrate.

Figure 5:
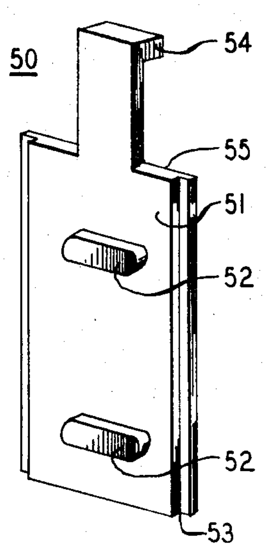
FIG. 5 is a perspective view of a camming member according to the present invention.

FIG. 5 is a perspective view of a camming member according to the present invention. Camming member 50, which can be made of an insulative molded elastic, comprises surface 51, surface 55 on the other side of surface 51, first and second transversely extending horizontal camming projections 52 having substantially semicylindrical ends, first and second vertical shoulders 53, and handle 54. The semicylindrical ends of camming projections 52 are adapted to coact with associated flanges 42 of plates 40 for urging substrates 60 against resilient spring contacts 70 on side frame 10. Further, handle 54 facilitates insertion and extraction of camming member 50 into and from device 90. It will be shown that upon insertion of camming member 50 into device 90, the semicylindrical ends of camming projections 52 ride along associated ramp portions 44 away from notches 43 and onto edge portions 45, whereas upon extraction of camming member 50 from device 90, the ends of camming projections 52 ride along associated ramp portions 44 away from edge portions 45 and into notches 43.

Figure 6:
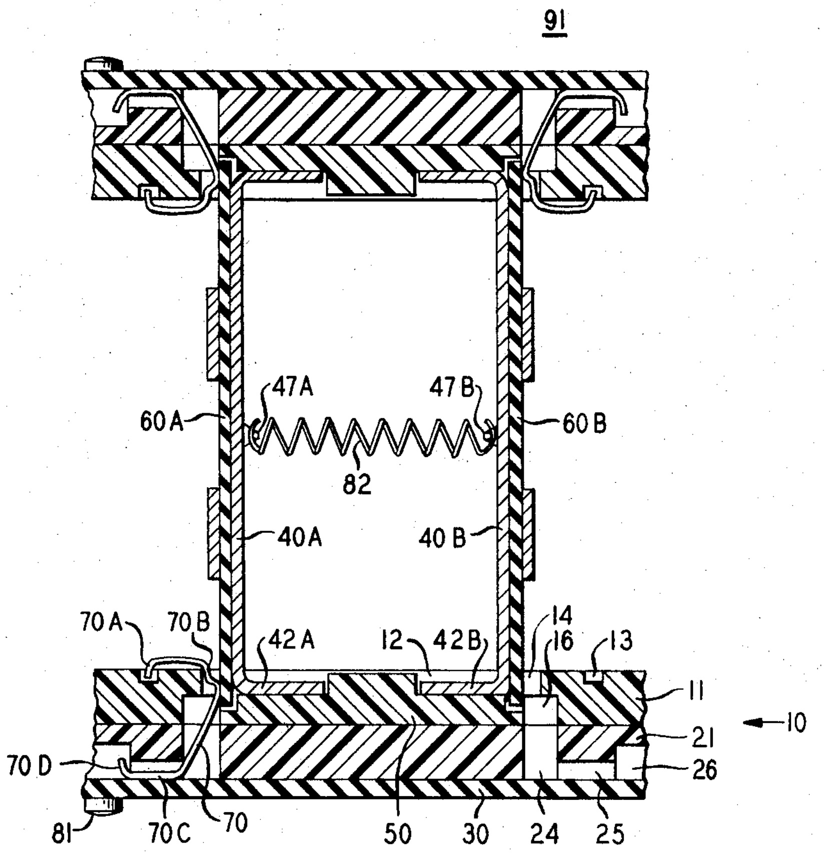
FIG. 6 is a top cross-sectional view of an assembled ceramic substrate module according to the present invention.

FIG. 6 is a top cross-sectional view of assembled ceramic substrate module 91 according to the present invention showing side frames 10, printed circuit board 30, backing plates 40A and 40B, camming member 50, and substrates 60A and 60B. The following explanation only applies to the lower half of module 91; a similar explanation applies to the upper half. Also, the lower right-hand portion of module 91 is shown without a contact 70 for purposes of clarity; however, it is understood that a contact 70 would normally be located there. Substrates 60A and 60B are respectively associated with plates 40A and 40B. Referring back to FIGS. 2 and 4, it is apparent that surface 66 of each substrate is in intimate contact with surface 46 of its associated plate. In addition, flange 42A of plate 40A is directed towards flange 42B of plate 40B. In light of the above, each plate acts as a structural support for its associated substrate in the assembled device. Also, flanges 42A and 42B of plates 40A and 40B are respectively associated with camming member 50. Finally, tension spring 82 mechanically connects plates 40A and 40B via mounting projections 47A and 47B respectively located on the plates. Spring 82 biases plates 40A and 40B towards each other in order to prevent their interfering with the removal and insertion of substrates 60A and 60B from module 91.

Screws 81 secure board 30, outer segment 21 and inner segment 11 of side frame 10 such that each path 33 of board 30 is adapted to engage intermediate portion 70C of an associated contact 70, while each terminal 65 of substrate 60 is adapted to engage intermediate portion 70B. It is apparent from FIG. 6 that contacts 70 are retracted inwardly towards their associated grooves 25 but because of the contacts' resilient properties, they are maintained in intimate contact with associated paths 33. In addition, each vertical slot 13 is adapted to receive end portions 70A of associated contacts 70, while each vertical slot 26 is adapted to receive end portions 70D. Further, vertical aperture 16 of inner segment 11 is in communicating relationship with vertical through slot 24 of outer segment 21. It is therefore apparent that each contact 70 extends from vertical slot 13, through horizontal groove 14, aperture 16, vertical slot 24, and horizontal groove 25, to vertical slot 26.

In the assembled module, the bottom edges of the substrates, the plates, and the camming members abut against surface 12 of inner segment 11. This, of course, causes each terminal of the substrates to register and align with its associated contact on the frame. Also, flanges 42A and 42B of plates 40A and 40B, respectively, rest against surface 51 of camming member 50, while surface 55 of camming member 50 rests against surface 22 of outer segment 21. Therefore, referring back to FIGS. 4 and 5, it is apparent that when camming member 50 is fully inserted within module 91, the semicylindrical ends of camming projections 52 sit on associated edge portions 45 of flanges 42A and 42B. Also, plates 40A and 40B cause each terminal of substrates 60A and 60B, respectively, to press against associated contacts 70 on frame 10 and also cause the vertical edges of the substrates to abut against walls 15 of frame 10.

The removal of a substrate from module 91 is now explained with reference to FIGS. 1 and 6. Upon the vertical extraction of camming member 50 from device 90, the semicylindrical ends of camming projections 52 ride along associated ramp portions 44 away from edge portions 45 and into notches 43. This causes plates 40A and 40B to approach each other along the longitudinal direction of device 90 because of the tension force provided by spring 82. Once the semicylindrical ends of camming projections 52 sit within associated notches, i.e., when camming member 50 is in the fully raised position, the plates exert a negligible force against their associated substrates thereby facilitating the removal of the substrates from module 91 for inspection, exchange, repair, et cetera.

The placement of a substrate into module 91 is now explained. First of all, the substrate is inserted into module 91 by sliding the vertical edges thereof vertically downward along the passageways formed by walls 15 of side frame 10 and shoulders 53 of camming members 50 such that surface 66 of the substrate is adjacent to surface 46 of its associated plate. Next, upon the vertical insertion of camming member 50 into device 90 by means of handle 54, the semicylindrical ends of camming projections 52 ride along associated ramp portions 44 away from notches 43 and onto edge portions 45. This provides a force which causes plates 40A and 40B to separate from each other along the longitudinal direction of device 90. This further causes each terminal 65 of the substrate to press against associated contacts 70 on side frame 10 and further causes the vertical edges of the substrate to abut against walls 15 of inner portion 11. As shown in FIG. 6, contacts 70 are retracted inwardly towards their associated grooves 14 but because of the contacts' resilient properties, they are maintained in intimate contact with associated terminals 65 on the substrate. In addition, steps 17 on walls 15 secure the upper edges of the substrate thereby preventing misplacement or misalignment thereof. It is apparent that module 91 is a mechanically intact unitary structure which does not require the use of special tools for its assembly and disassembly. If necessary, device 90 can be readily combined with means for forcing air through and between the individual modules.

Figure 7:
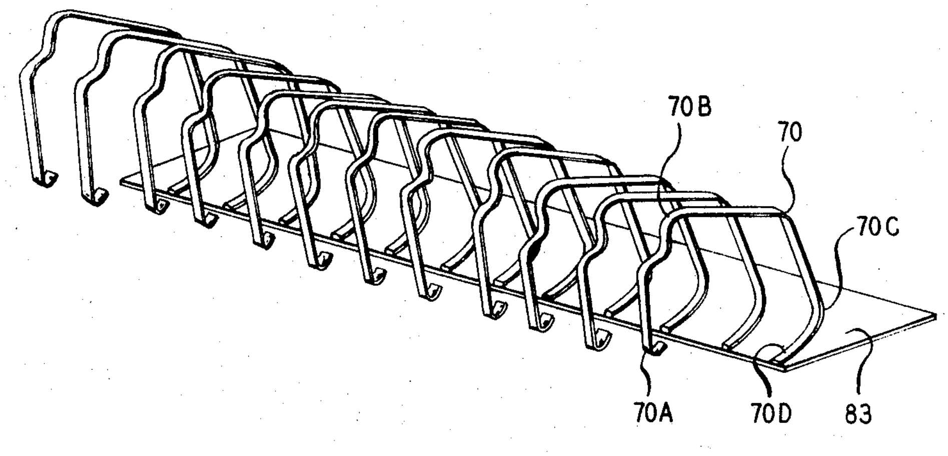
FIG. 7 is a perspective view of a structure which allows for the mass production and mass assembly of the resilient spring contacts into the device of FIG. 1.

FIG. 7 is a perspective view of a structure which allows for the mass production and mass assembly of resilient spring contacts 70 into device 90 of FIG. 1. As shown in the figure, contacts 70 are originally manufactured in comb form with common metal strip 83 mechanically connecting the contacts along end portions 70D thereof. To effect the mass assembly of contacts 70 into side frame 10, end portions 70A of the contacts are simultaneously inserted through vertical slot 24 of outer segment 21, then through vertical aperture 16 of inner segment 11, and finally through associated horizontal grooves 14. Next, end portions 70 are simultaneously placed into vertical slot 13 of inner segment 11, as shown in FIG. 6. End portions 70D are then forced into vertical slot 26 of outer segment 21 such that upon the breaking of metal strip 83 along a prescored parting line, end portions 70D fall securely within the vertical slot 26, as shown in FIG. 6. It is therefore apparent that contacts 70 are secured to frame 10 without the use of screws or other similar mechanical fastening means.

Figure 8:
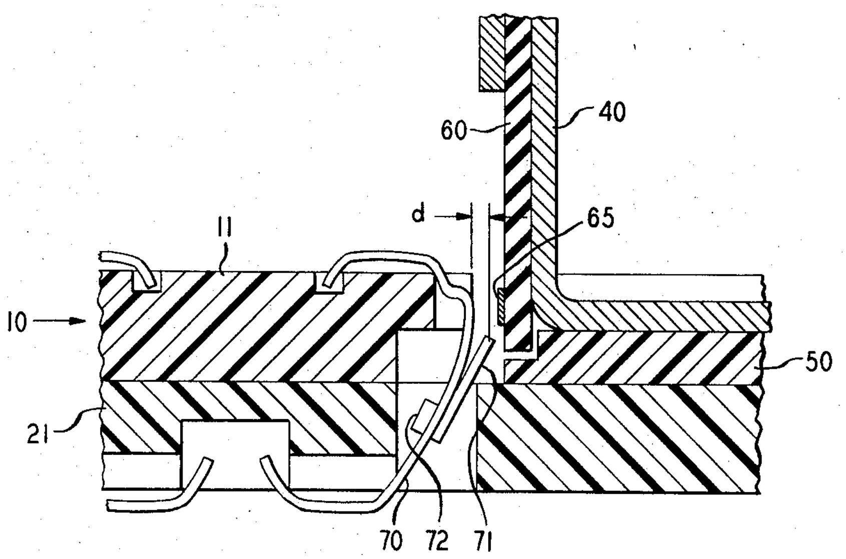
FIG. 8 is an enlarged top cross-sectional view of the module of FIG. 6 showing another embodiment of a resilient spring contact according to the present invention.

FIG. 8 is an enlarged top cross-sectional view of module 91 showing another embodiment of a resilient spring contact according to the present invention. Shown are inner and outer segments 11 and 21 of side frame 10, backing plate 40, camming member 50, substrate 60, and specially designed resilient spring contact 70 including nonconductive plastic strips 71 and 72. The central portion of contact 70 is substantially sandwiched in between the plastic strips. Strips 71 and 72 are advantageously heat sealed together. It is apparent from FIG. 8 that the freely extended end of strip 71 must be displaced a small finite distance *d* before terminals 65 of substrate 60 press against associated contacts 70. Therefore, plastic strip 71 acts as an anticontact means so that insertion and removal of the substrate is accomplished without the scuffing, nicking, and catching of terminals 65 by contacts 70. Manufacture and assembly of these specially designed contacts including the plastic strips can be done in a manner similar to that described with respect to FIG. 7.

From the foregoing discussion, the following additional advantages of the described invention are apparent. First of all, the elements of device 90 are mass producible. Secondly, since contacts 70 are secured to side frame 10 without the use of mechanical fastening means, they can be made very narrow thereby facilitating high density packaging. In addition, one group of contacts 70 can be readily replaced by another having different physical and electrical properties. Thirdly, no mechanical fastening means, such as rivets or bolts, are required to secure plates 40 and camming members 50 to device 90. Also, each plate 40 can be readily replaced by another having different physical and thermal properties, while each camming member 50 can be replaced by another having different physical properties. Therefore, changing either the contacts, the plates, and/or the camming members can affect the heat dissipative properties of the device and/or the magnitude of the contact force applied to the substrates' terminals. Further, device 90 is readily adaptable to modular construction, thereby yielding a simple, inexpensive, and reliable structure. In addition, insertion and removal of a substrate from device 90 do not require the use of soldering techniques and do not result in damage to the substrates. Also, device 90 permits free passage of air through and between individual modules. Therefore, heat can be dissipated by way of conduction from the substrate to its associated plate and then by way of convection from the plate and its fins to the air. Heat can also be dissipated by way of convection directly from the substrate to the air.

While the discussion has concentrated on the use of device 90 for interconnecting a plurality of integrated circuit ceramic substrate pairs, it will be apparent to those skilled in the art that device 90 is readily adaptable for use with conventional printed circuit boards. However, since device 90 lends itself to relatively small dimensions, it is particularly suitable for ceramic substrates, such substrates usually being smaller than ordinary printed circuit boards.

While the arrangement according to the present invention for interconnecting a plurality of integrated circuit ceramic substrate pairs has been described in terms of specific embodiments, it will be apparent to those skilled in the art that many modifications are possible within the spirit and scope of the described principle.

What is claimed is:

1. An electrical interconnection device comprising:

a. first and second printed circuit boards, the first surface of each board having a predetermined pattern of flat conductive paths thereon;

b. a substantially rectangular insulative frame including 1. said boards fixedly attached thereto in parallel spaced relationship to each other, the first surface of each board being adjacent to an associated external portion of said frame, 2. a plurality of substantially U-shaped channel means oppositely located along the internal portions of said frame, and 3. a plurality of vertical rows of horizontal resilient spring contacts, each channel means having associated therewith two rows of contacts such that the contacts from each row protrude outwardly into said channel means and electrically connect to associated conductive paths on the first surface of said boards; and c. a plurality of integrated circuit ceramic substrate modules located longitudinally along said device, each module further comprising 1. first and second vertical ceramic substrates placed perpendicularly to said boards, the first surface of each substrate having a predetermined pattern of flat conductive terminals located along the vertical edges thereof, 2. first and second vertical camming members individually placed within associated channel means in parallel relationship to said boards, and 3. first and second vertical backing plates respectively associated with said first and second substrates, the first surface of each plate being directly adjacent to and in intimate contact with the second surface of its associated substrate;

vertical insertion of said camming members into their associated channel means applying a force to said first and second backing plates to separate the plates along the longitudinal direction of said device and to press the conductive terminals located along the vertical edges of said substrates into electrical engagement with associated vertical rows of contacts located on the frame.

2. The device of claim 1 wherein:

a. each camming member further comprises a plurality of parallel transversely extending projections on one surface thereof; and b. each backing plate further comprises first and second parallel flanges directed perpendicularly to the second surface thereof, said flanges further including a plurality of associated notches, ramp portions, and edge portions;

so that upon vertical insertion of said camming members into their associated channel means, the ends of said projections ride along said ramp portions away from said notches and onto said edge portions, and upon vertical extraction of said camming members form their associated channel means, the ends of said projections ride along said ramp portions away from said edge portions and into said notches.

3. The device of claim 1 wherein:

a. each contact is substantially C-shaped; and b. said frame in association with each vertical row of contacts further comprises:

1. a first vertical slot located adjacent to the channel means associated with said row of contacts and adapted to receive a first end portion of each contact, 2. a first plurality of horizontal grooves located within said associated channel means in perpendicular relationship to said boards, each groove being adapted to receive a first intermediate portion of an associated contact, 3. a second plurality of horizontal grooves located on the external portion of the frame associated with said row of contacts and in parallel relationship to said boards, each groove being adapted to receive a second intermediate portion of an associated contact, and 4. a second vertical slot located adjacent to said second plurality of grooves and adapted to receive the second end portion of each contact;

such that the first intermediate portion of each contact engages an associated conductive terminal on said substrates and the second intermediate portion of each contact engages an associated conductive path on said boards.

4. The device of claim 3 wherein each row of contacts further comprises a nonconductive plastic strip substantially located along the central portion of each contact for separating the contacts from their associated conductive terminals on said substrates before insertion of said camming members into their associated channel means.

5. The device of claim 1 wherein each backing plate further comprises a plurality of fins for dissipating heat generated by the plate's associated substrate.

6. The device of claim 1 wherein each backing plate is made of aluminum.

7. The device of claim 1 also comprising means for biasing said first and second backing plates towards each other.

8. The device of claim 1 also comprising means for forcing air through and between said modules.

9. The device of claim 1 wherein each channel means further includes on the upper portion thereof means for restraining the upper edges of its associated substrates.

* * * * *